United States Patent
Nishioka

(10) Patent No.: US 9,281,076 B2
(45) Date of Patent: Mar. 8, 2016

(54) SEMICONDUCTOR DEVICE

(71) Applicant: PS4 Luxco S.a.r.l., Luxembourg (LU)

(72) Inventor: Naohisa Nishioka, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 140 days.

(21) Appl. No.: 14/163,583

(22) Filed: Jan. 24, 2014

(65) Prior Publication Data

US 2014/0140160 A1 May 22, 2014

Related U.S. Application Data

(63) Continuation of application No. 12/609,907, filed on Oct. 30, 2009, now Pat. No. 8,638,631.

(30) Foreign Application Priority Data

Oct. 31, 2008 (JP) ................. 2008-281595

(51) Int. Cl.
*G11C 17/18* (2006.01)
*G11C 13/00* (2006.01)
*G11C 7/22* (2006.01)

(52) U.S. Cl.
CPC ............ *G11C 17/18* (2013.01); *G11C 13/0002* (2013.01); *G11C 13/0004* (2013.01); *G11C 7/22* (2013.01)

(58) Field of Classification Search
CPC ..... G11C 13/0002; G11C 13/004; G11C 7/22
USPC .................. 365/225.7, 189.07, 196
See application file for complete search history.

(56) References Cited

U.S. PATENT DOCUMENTS

| | | | | |
|---|---|---|---|---|
| 5,231,315 A * | 7/1993 | Thelen, Jr. | ............... | H03F 1/301 327/103 |
| 6,185,705 B1* | 2/2001 | Cutter | .................... | G11C 17/18 324/537 |
| 6,545,928 B1* | 4/2003 | Bell | ........................ | G11C 17/18 365/200 |
| 7,215,177 B2* | 5/2007 | Sueoka | .................. | G11C 17/18 257/E23.149 |
| 7,333,383 B2* | 2/2008 | Vogelsang | ............. | G11C 17/18 365/225.7 |
| 7,548,448 B2* | 6/2009 | Philipp | .................. | G11C 11/56 365/158 |
| 7,715,219 B2* | 5/2010 | Monreal | ................ | G11C 17/16 365/225.7 |
| 7,725,844 B2* | 5/2010 | Aipperspach | .......... | G11C 17/16 326/38 |
| 8,294,475 B2* | 10/2012 | Fellner | ................... | G11C 17/16 324/550 |
| 8,780,604 B2* | 7/2014 | Liao | ....................... | G11C 17/16 365/225.7 |
| 9,036,441 B2* | 5/2015 | Oh | .......................... | G11C 17/16 365/104 |
| 9,048,860 B1* | 6/2015 | Quinn | .................... | H03M 1/46 |
| 9,052,352 B2* | 6/2015 | Kim | ....................... | G11C 17/18 |
| 9,082,475 B2* | 7/2015 | Kim | ....................... | G11C 7/22 |
| 2014/0022855 A1* | 1/2014 | Jang | ....................... | G11C 17/16 365/189.07 |
| 2014/0253220 A1* | 9/2014 | Kirihata | ................ | H01H 85/05 327/525 |

* cited by examiner

*Primary Examiner* — Viet Q Nguyen

(57) ABSTRACT

A semiconductor device has an antifuse element and a measurement unit. The antifuse element stores information according to whether the antifuse element is in the broken or unbroken state. The measurement unit determines a resistance value related to the resistance value of the broken antifuse element.

6 Claims, 4 Drawing Sheets

SEMICONDUCTOR DEVICE

This application is a continuation of U.S. patent application Ser. No. 12/609,907, filed Oct. 30, 2009, now U.S. Pat. No. 8,638,631, issued Jan. 28, 2014, which is based upon and claims the benefit of priority from Japanese Patent Application No. 2008-281695, filed on Oct. 31, 2008, the contents of which prior applications are incorporated herein in their entirety by reference.

BACKGROUND OF THE INVENTION

1. Field of the Invention

The present invention relates to a semiconductor device having an antifuse element.

2. Description of Related Art

A large-capacity semiconductor memory, in particular a DRAM (Dynamic Random Access Memory) is provided with a redundant memory for improvement of yield, so that when there exists a defective memory cell, the column or word containing the defective memory cell is replaced with the redundant memory. The replacement with the redundant memory is carried out by writing address information indicating the column or word to be replaced in a ROM (Read Only Memory).

Fuse ROMs have been widely used as this type of ROMs. A fuse ROM includes a plurality of fuse elements, and information is written by selectively cutting the fuse elements.

The cutting of the fuse elements is carried out with the use of a laser beam. Therefore, the employment of the fuse ROMs involves various restrictions. For example, a large sized laser irradiation apparatus is required, and the writing of information is allowed only in the wafer stage (before the assembly stage) of the manufacturing process.

In order to overcome these problems, there have recently been proposed ROMs employing electrically breakable antifuse elements. An antifuse element has a configuration basically identical to that of a capacitor. Specifically, an open circuit is established between the opposite terminals of the antifuse element in its unbroken state, whereas a short circuit is established between the opposite terminals of the antifuse element when a dielectric layer is broken by applying a high voltage between the terminals. Information is recorded according to the conductive and non-conductive states of the antifuse element.

The antifuse element can be downsized compared to a fuse element, resulting in reduction of the occupying area. Additionally, the antifuse element enables writing (breakdown) by means of a high voltage generated within the semiconductor device, eliminating the need of a large-scaled laser irradiation apparatus. Further, the antifuse element enables writing even after completion of the assembly process, contributing to further improvement of the yield. A semiconductor device having such an antifuse element is described for example in Japanese Laid-Open Patent Publication No. 2008-47215 (Patent Document 1). More specifically, Patent Document 1 describes a technique in which there is stored in an antifuse element various information, including information on defective cells to be replaced with redundant cells, information relating to level adjustment of an internal power generating circuit, and information relating to impedance adjustment of an input/output circuit.

SUMMARY

As described above, en antifuse element enables writing (breakdown) even after completion of the assembly process. When various information is stored in the antifuse element, as described above, it is necessary to accurately know the resistance value of the antifuse element after its breakdown in order to confirm that the information has been stored. However, in a related semiconductor device having an antifuse element, it is impossible to now the resistance value of the broken antifuse element. The present inventor has recognized that various problems are encountered if the resistance value of the antifuse element is not known.

For example, it is possible, before an assembly process, to obtain an evaluation value corresponding to the resistance value of the broken antifuse element by conducting measurement on a TEG (Test Element Group). However, the evaluation value often differs from the actual resistance value of the broken antifuse element. Further, it is impossible to find variation in manufacture on the basis of the evaluation value.

Furthermore, after completion of the assembly process, the resistance value of the antifuse element cannot be measured any more since the antifuse element has been packaged.

If the resistance value of the broken antifuse element is unknown, the only way to set the breakdown voltage conditions is to use the determination result whether the antifuse element is defective or not, which makes it difficult to set the conditions appropriately. Moreover, even if the antifuse element is determined to be defective, it is not possible to identify whether the cause of the defect resides in the antifuse element itself or in other circuits such as a differential determination unit.

The present invention seeks to solve one or more of the above problems, or to improve upon those problems at least in part.

In an embodiment, there is a provided a semiconductor device that has an antifuse element storing information as one of a broken state and an unbroken state thereof, and a measurement unit operative to measure a resistance value relative to a resistance value of the antifuse element in the broken state.

The provision of the measurement unit determining a resistance value related (or relative) to the resistance value of the antifuse element in its broken state makes it possible to determine the resistance value related (or relative) to the resistance value of the broken antifuse element.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

A semiconductor device according to the present invention is a semiconductor memory device having an antifuse element, for example, a DRAM having a redundant memory. The description below will be made only on the parts related to the present invention. The description of the other parts of the semiconductor device according to the invention will be omitted since they can be configured using known techniques.

Figure 1:
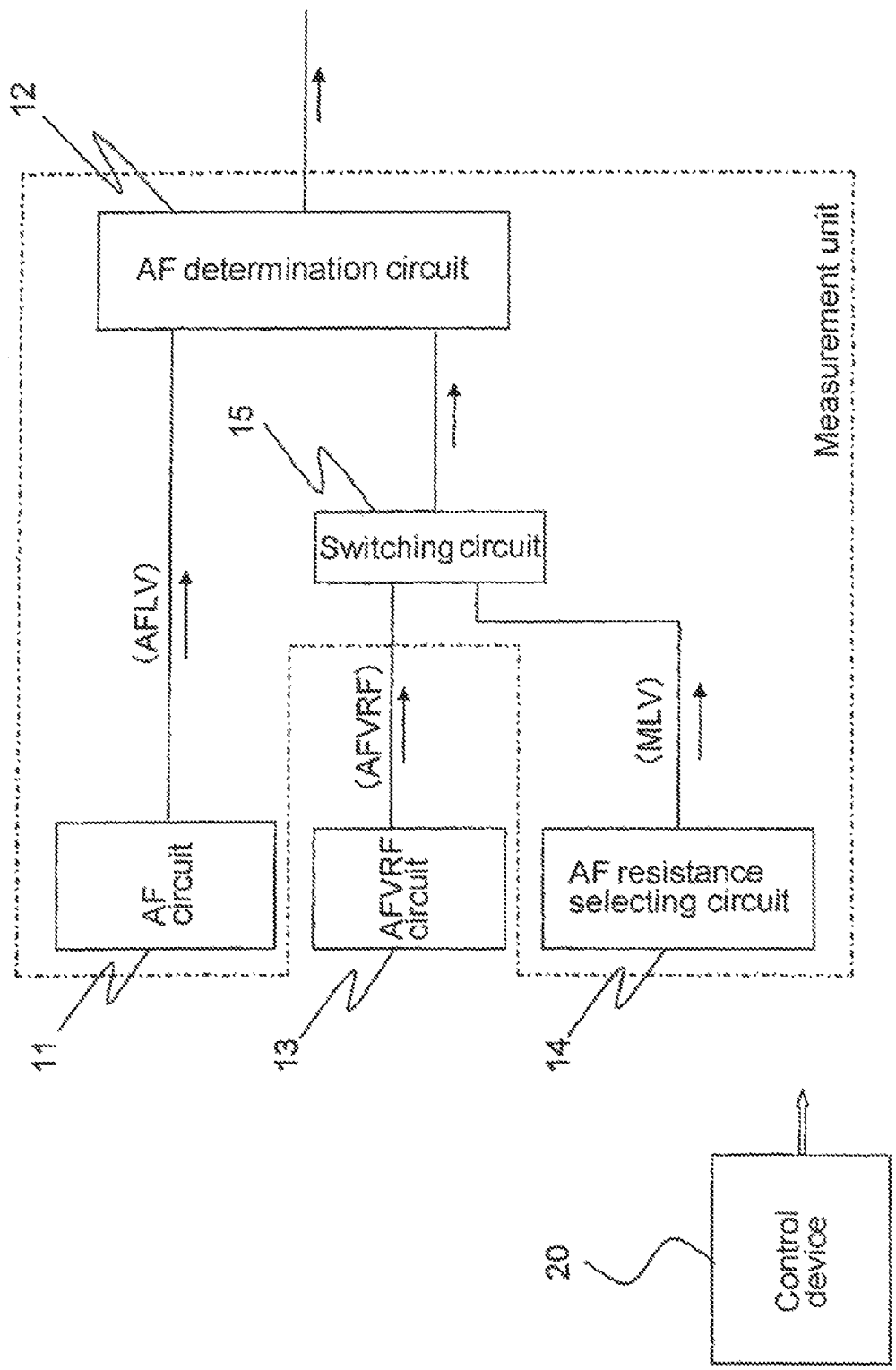
FIG. 1 is a block diagram showing a principal part of a semiconductor device according to an embodiment of the present invention.

FIG. 1 is a block diagram showing a principal part of a semiconductor device according to a first embodiment of the present invention. As shown in FIG. 1, the semiconductor device has an AF (AntiFuse) circuit 11, an AF determination circuit 12, an AFVRF (AF Verify) circuit 13, an AF resistance selecting circuit 14, and a switching circuit 15. The AF circuit 11, the AF is determination circuit 12, the AFVRF circuit 13, the AF resistance selecting circuit 14, and the switching circuit 15 perform operations as described below according to a signal issued by a control device 20 provided outside the semiconductor device.

The AF circuit 11 includes an antifuse element (hereafter, referred to as the AF element), and generates and outputs a detection voltage corresponding to the state of the AF element. This means that the AF circuit 11 functions as a detection voltage generating unit for generating a detection voltage. Detection voltages (AFLV) generated by the AF circuit 11 include a first detection voltage for determining whether the AF element is in the broken state or in the unbroken state (during the normal operating mode), and a second detection voltage for measuring the resistance value of the AF element in the broken state (during the AF element breakdown resistance value measurement test mode).

The AF determination circuit 12 compares the detection voltage AFLV received from the AF circuit 11 with a reference voltage, and outputs a comparison result. This means that the AF determination circuit 12 functions as a comparator. The reference voltage is defined by a determination voltage AFVRF from the AFVRF circuit 13 or a measurement voltage MLV from the AF resistance selecting circuit 14, as described below.

The AFVRF circuit 13 generates and outputs a determination voltage AFVRF which is used for determining whether the AF element is in the broken state or in the unbroken state. This means that the AFVRF circuit 13 functions as a determination voltage generating unit.

The AF resistance selecting circuit 14 generates and outputs a measurement voltage MLV which is used for measuring the resistance value of the AF element in the broken state. This means that the AF resistance selecting circuit 14 functions as a measurement voltage generating unit. The AF resistance selecting circuit 14 is capable of generating a plurality of different measurement voltages, and the AF resistance selecting circuit 14 outputs one measurement voltage MLV that is selectively generated according to an external command.

The switching circuit 15 functions as a switching unit which outputs, as the reference voltage, either the determination voltage AFVRF from the AFVRF circuit 13 or the measurement voltage MLV from the AF resistance selecting circuit 14 to the AF determination circuit 12.

Operation of the semiconductor device shown in FIG. 1 will be described.

When determining whether the AF element is in the broken or unbroken state, the switching circuit 15 selects the determination voltage AFVRF from the AFVRF circuit 13, and supplies the determination voltage AFVRF to the AF determination circuit 12 as the reference voltage. The AF determination 12 compares the detection voltage ARV received from the AF circuit 11 with the determination voltage AFVRF as the reference voltage. When the detection voltage AFLV is higher than the reference voltage, the AF determination circuit 12 outputs a determination result indicating that the AF element is in the unbroken state. When the detection voltage AFLV is lower than the reference voltage, the AF determination circuit 1 outputs a determination result indicating that the AF element is in the broken state. The determination result is supplied to a redundant control circuit in a memory circuit (not shown).

When measuring the resistance value of the AF element, the switching circuit 15 selects the measurement voltage MLV received from the AF resistance selecting circuit 14, and supplies the measurement voltage MLV to the AF determination circuit 12. The AF determination circuit 12 compares the detection voltage AFLV from the AF circuit 11 with the measurement voltage MLV as the reference voltage, and outputs a comparison result. The comparison result is transferred to a data input/output terminal to which data to be written in or read from the memory circuit is supplied.

This means that, during the AF element breakdown resistance value measurement test mode, an electrical path is formed between the output of the AF determination circuit 12 and the data input/output terminal (not shown).

When measuring the resistance value of the AF element, the measurement voltage MLV generated by the AF resistance selecting circuit 14 is changed (increased or decreased) stepwise, while the detection voltage AFLV is compared with each of the measurement voltages MLV as the reference voltage. According to the shown embodiment, as described above, the measurement voltages MLV are given to the AF determination circuit 12 as candidate voltages for the detection voltage AFLV.

When the AF determination circuit 12 determines that the measurement voltage MLV is changed from a value lower (or higher) than the detection voltage AFLV to a higher (or lower) value, the comparison result also varies. Therefore, the relationship between the values of the measurement voltages MLV and the resistance values of the resistances (candidate resistance values) of the AF resistance selecting circuit 14 can be previously determined so that the resistance value of the AF element can be obtained based on the comparison result by the AF determination circuit 12. In other words, according to the present invention, the resistance value of the AF element in the broken state can be specified by comparing the resistance with the candidate resistance values relating thereto.

Describing more specifically, when the detection voltage AFLV from the AF circuit 11 is compared with the measurement voltage MLV from the AF resistance selecting circuit 14 by the AF determination circuit 12, a candidate resistance value closest to the resistance value of an AF element in the broken state included in the AF circuit 11 is determined as the resistance value related to (e.g. relative to) the resistance value of the AF element in the broken state. The function of determining the resistance value of the AF element by using the candidate resistance value shall be herein referred as the measurement function. This means that the AF circuit 11, the AF resistance selecting circuit 14, (the switching circuit 15), and the AF determination circuit 12 enclosed by the dash-dot line in FIG. 1 collectively function as a measurement unit which determines the resistance value related to the resistance value of the AF element in the broken state included in the AF circuit 11.

The semiconductor device according to the present invention will be described in further detail by additionally referring to FIGS. 2 to 6.

Figure 2:
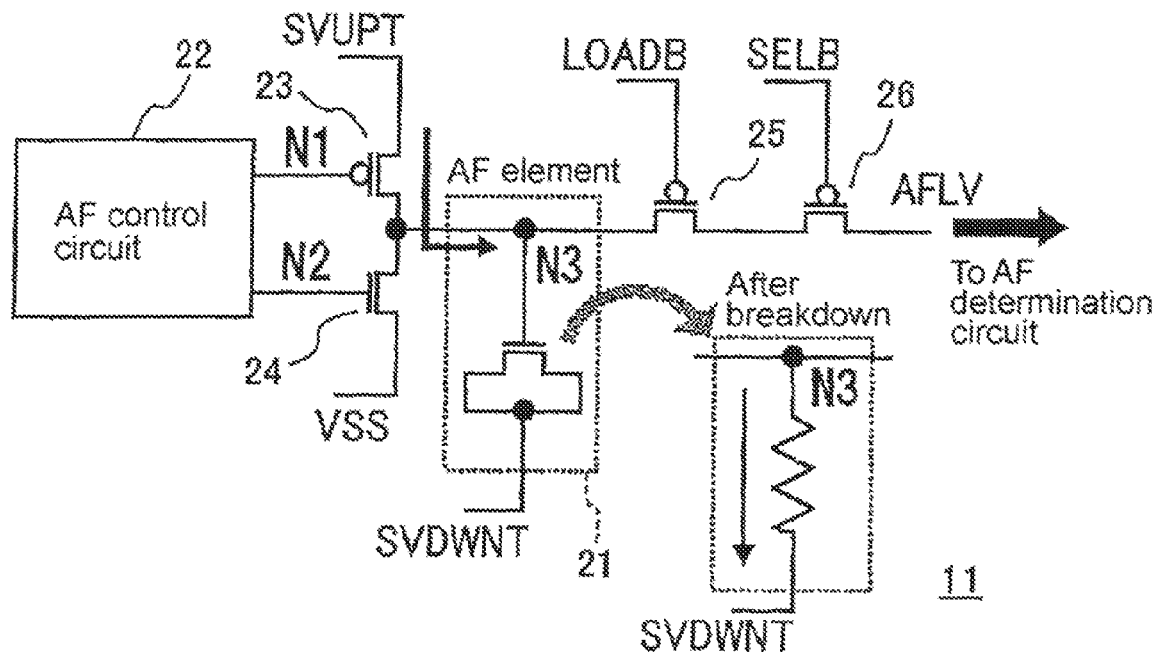
FIG. 2 is a circuit diagram showing an example of an internal configuration of an antifuse (AF) circuit included in the semiconductor device of FIG. 1.

FIG. 2 is a circuit diagram showing an example of an internal configuration of the AF circuit 11, in which there are provided an AF element 21, an AF control circuit 22, an N-channel MOS transistor (hereafter, abbreviated as NMOS) 23, and a P-channel MOS transistor (hereafter, abbreviated as PMOS) 24. The shown AF circuit 11 further includes two PMOSs 25 and 26 for outputting a detection voltage AFLV to the AF determination circuit 12. The AF element 21, the AF control circuit 22, the PMOSs 23, 25, 26, and the NMOS 24 operate based on a signal from the control device 20 shown in FIG. 1.

Although the shown AF circuit 11 has only one AF element 21, the AF circuit 11 usually includes a plurality of AF elements. The AF element 21 in this embodiment is formed of an MOS transistor (NMOS) the source and the drain of which are short-circuited. The MOS transistor having short-circuited source and drain operates in a similar manner to a capacitor. The MOS transistor, or the AF element can be made a virtual resistance element by applying a high voltage between the gate and the source (drain) to break the gate insulation film.

The AF element is not limited to an MOS capacitor utilizing an MOS transistor structure, but may be provided, for example, by utilizing a capacitor structure in a DRAM memory cell.

AF Element Breaking Operation:

In order to break the AF element, a SVUPT line is driven to a voltage higher than a normal power-supply voltage while a SVDWNT line is driven to a negative voltage. Then, the PMOS 23 and the NMOS 24 are controlled by selection signals N1 and N2 from the AF control circuit 22, so that either a SVUPT potential or a VSS potential is supplied to an end (gate) N3 of the AF element 21. Specifically, when the AF element is to be broken, low-level control signals N1 and N2 are supplied from the AF control circuit 22 operating according to a signal from the control device 20, so that the PMOS 23 and the NMOS 24 are turned ON and OFF, respectively. When the AF element 21 is not to be broken, in contrast, both the control signals N1 and N2 are made high level, and the MOS 23 and the NMOS 24 are turned OFF and ON, respectively.

During the AF element breaking operation, a read signal LOADB and a fuse selecting signal SELB supplied from the control device 20 are both maintained at a high level, and the PMOSs 25 and 26 are both OFF. Accordingly, when the AF element 21 is broken, a high voltage is applied to an end of the AF element 21 while a negative voltage is applied to the other end, whereby the gate insulation film of the NMOS forming the AF element 21 is broken and the AF element 21 becomes a virtual resistance element. Upon completing the AF element 21 breaking operation, the SVUPT line and the SVDWNT line are returned to their normal levels under the control of the control device 20 (the SVUPT is returned to a peripheral power-supply voltage level VPERI, and the SVDWNT line is returned to the VSS level).

Operation for Determining the State of AF Element 21:

In order to determine whether or not the AF element 21 is broken (to read the AF), the fuse selecting signals N1 and N2 supplied from the AF control circuit 22 are caused to assume a high level and a low level, respectively. The read signal LOADB and the fuse selecting signal SELB are both caused to assume a low level by the control device 20. As a result, the PMOS 23 and the NMOS 24 are both OFF and the PMOSs 25 and 26 are both ON.

Accordingly, during the operation to determine the state of the AF element 21, the AF element 21 is connected to the AF determination circuit 12 while being connected to the VSS power supply.

Figure 3:
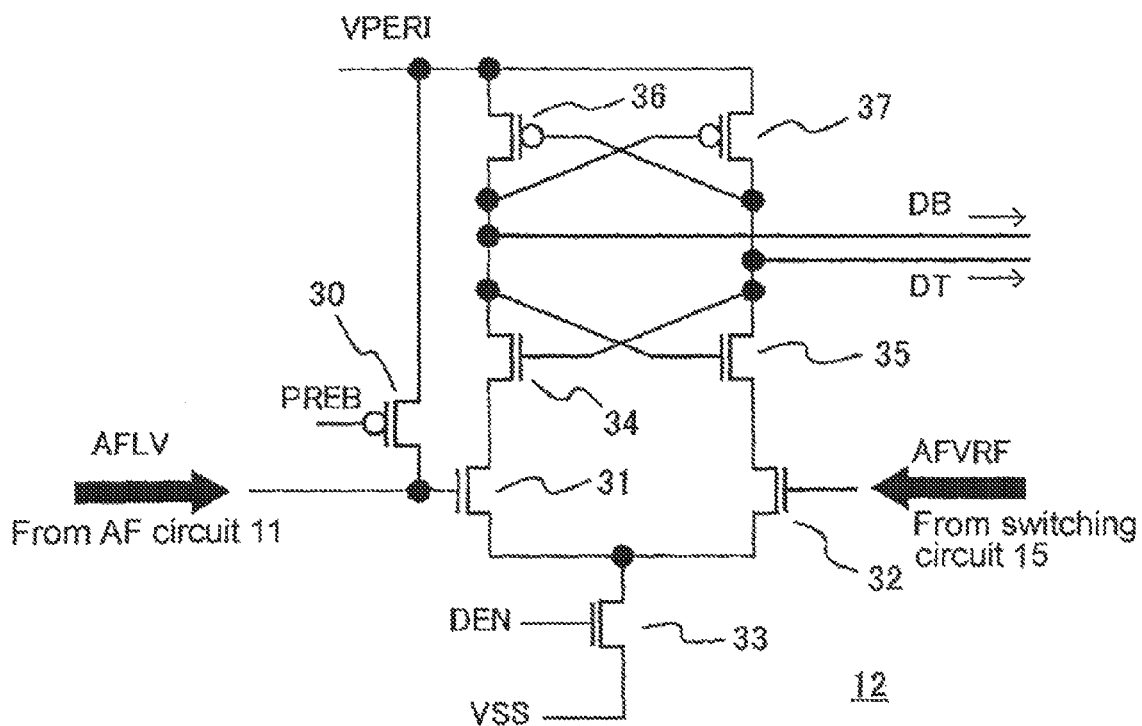
FIG. 3 is a circuit diagram showing an example of an internal configuration of an AF determination circuit included in the semiconductor device of FIG. 1.

The operation to determine the state of the AF element 21 will be further described by additionally and temporarily referring to the AF determination circuit 12 shown in FIG. 3.

While the AF circuit 11 is placed in the state as described above, the AF determination circuit 12 shown in FIG. 3 is supplied with a precharge signal PREB from the control device. The precharge signal PREB is held at a low level for a certain period of time, whereby a node N3 as an end (gate) of the AF element 21 shown in FIG. 2 is charged to the peripheral power-supply voltage VPERI via a PMOS 30 of the AF determination circuit 12 (see FIG. 3). After that, the precharge signal PREB is made high level. If the AF element 21 has been broken and operates as a resistance element at this time, the voltage level of the node N3 gradually drops toward the voltage level of the SVDWNT line (toward the VSS level). If the AF element 21 is not broken, in contrast, the voltage level of the node N3 remains at the charged level VPERI. These two different voltage levels of the node N3 are supplied to the AF determination circuit 12 as detection voltages (antifuse levels AFLV).

When measuring the resistance value of the AF element 21 as well, the voltage level of the node N3 is supplied to the AF determination circuit 12 as the detection voltage AFLV in the same manner as described above.

The internal configuration of the AF determination circuit 12 will be described specifically by referring to FIG. 3 again. The AF determination circuit 12 includes, in addition to the above-mentioned PMOS 30 supplied with the precharge signal PREB, differential amplifier formed of NMOSs 31, 32, 33, and a latch circuit formed of NMOSs 34, 35 and PMOSs 36, 37.

When the determination enable signal DEN becomes a high level under the control of the control device 20, the AF determination circuit 12 compares the detection voltage AFLV received from the AF circuit 11 with the reference voltage received from the switching circuit 15, and outputs determination output signals DB and DT according to a difference therebetween.

As described in relation to FIG. 2, the AF determination circuit 12 is supplied with the detection voltage ARV from the AF circuit 11 when the precharge signal PREB becomes a high level. If the AF element 21 is broken, the detection voltage AFLV decreases to the VSS level along the elapse of time, while the rate of the decrease depends on the resistance value of the AF element 21. This means that the detection voltage AFLV continues to exhibit a value according to the resistance value of the AF element 21 until a certain period of time has elapsed after the precharge signal PREB becomes a high level. Thus, the timing to make the determination enable signal DEN high is set at an appropriate timing during when the detection voltage AFLV from the AF circuit 11 exhibits value according to the resistance value of the AF element 21.

When determining whether the AF element 21 is in the broken or unbroken state, the AF determination circuit 12 is supplied with a determination voltage AFVRF as a reference voltage from the AFVRF circuit 13.

Figure 4:
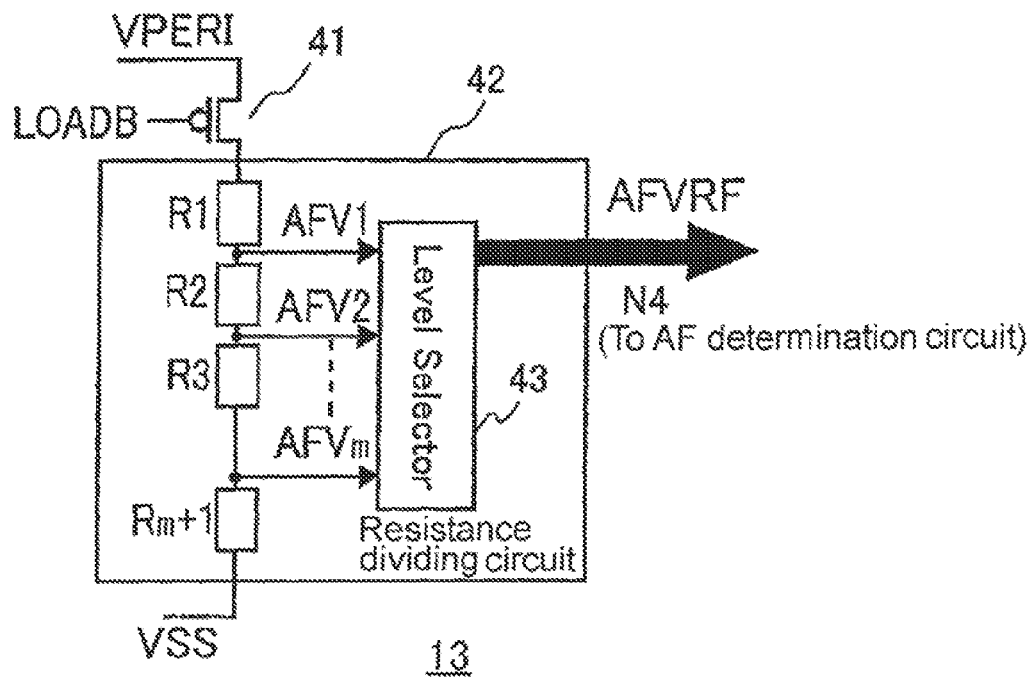
FIG. 4 is a block diagram showing an example of an internal configuration of an AFVRF (AF Verify) circuit included in the semiconductor device of FIG. 1.

FIG. 4 is a block diagram showing an example of the internal configuration of the AFVRF circuit 13. The AFVRF circuit 13 has a PMOS 41 connected between a VPERI line and a VSS line, and a resistance dividing circuit 42. The resistance dividing circuit 42 has a plurality (n+1) resistances (resistance elements) R1 to Rm+1 serially connected to each other, and a level selector 43 which is connected to the mutual connection points between these resistances and selectively outputs, as the determination voltage AFVRF, one of the voltages AFV1, AFV2, AFV3, ..., and AFVm at one of the connection points.

The plurality of resistances R1 to Rm+1 are set such that the voltages AFV1 to AFVm obtained by resistance division by these resistances are differed from each other by constant intervals (voltage differences), and the median value of these voltages is equal to a predetermined value. This predetermined value is a median value between two detection voltage values output by the AF circuit 11 when determining whether the AF element 21 is broken or not broken, that is, a median value between the voltage level (design value) expected when the AF element 21 is broken and the voltage level (design value) expected when the AF element 21 is not broken.

The level selector 43 is formed, for example, by a plurality of transistor switches respectively connected between the mutual connection points and the output terminal. Only one of these transistor switches is turned ON by applying a selection signal to the gates, or the control terminals of the transistor switches so that one of the voltages AFV1 to AFVm is selectively output. It is previously determined which one of the voltages AFV1 to AFVm is output, by conducting a test in the reference voltage adjustment test mode. This test is conducted under the control of the control device 20 (FIG. 1), such that the plurality of transistor switches are turned ON sequentially and one at a time, and the voltages AFV1 to AFVm obtained at the time when the transistor switches are turned ON are measured. Then, a value closest to the median value between the two detection voltages (design values) that can be output by the AF circuit 11 when determining whether the AF element 21 is broken or not broken is employed. Information on which transistor switch is turned ON is stored in a memory using an electric fuse (not shown).

In the normal operating mode, the level selector 43 selects one of the voltages AFV1 to AFVm based on the information stored in the memory not shown, and outputs the selected one as the determination voltage AFVRF.

Thus, in the normal operating mode, the determination output DT from the AF determination circuit 12 assumes a low level while the determination output DB assumes a high level when the AF element 21 is broken. In contrast, when the AF element 21 is not broken, the determination output DT assumes a high level while the determination output DB assumes a low level.

Figure 5:
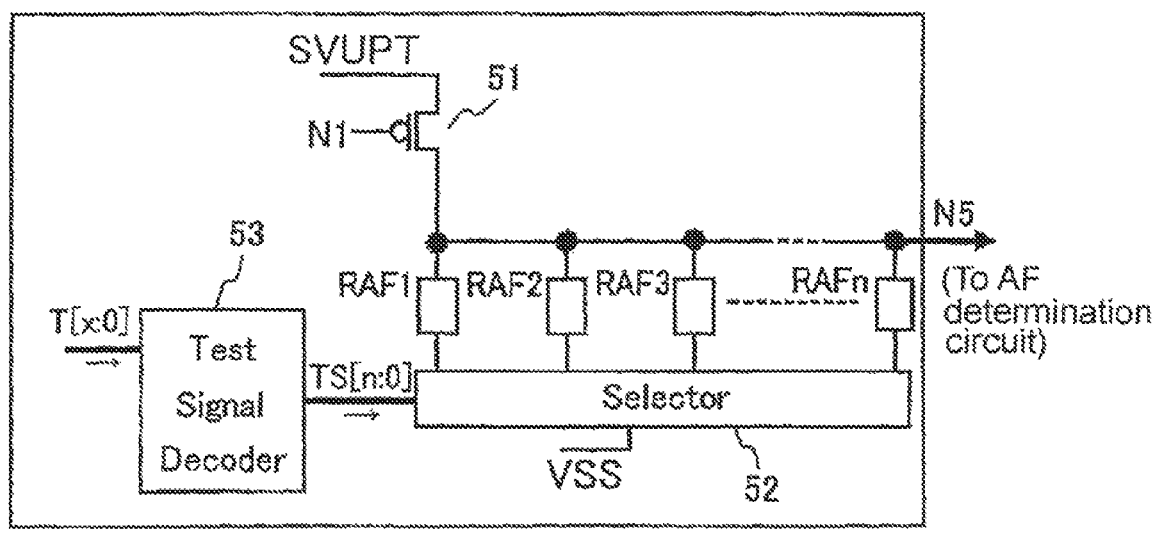
FIG. 5 is a block diagram showing an internal configuration of an AF resistance selecting circuit included in the semiconductor device of FIG. 1.

Operation for Measuring Resistance Value of AF Element 21:

Referring additionally to the AF resistance selecting circuit 14 shown in FIG. 5, the operation for measuring the resistance value of the AF element 21 will be described. As shown in FIG. 5, the AF resistance selecting circuit 14 has a PMOS 51 connected between a SVUPT line and a VSS line, a plurality of resistances (resistance elements) RAF1 to RAFn, and a resistance selector 52. The AF resistance selecting circuit 14 further has a test signal decoder 53 connected to the resistance selector 52, and the test signal decoder 53 operates according to a signal from the control device 20.

The PMOS 51 is turned ON and OFF according to a precharge signal PREB (the same signal as shown in FIG. 3). When supplied with a test code T[X:0] from the control device 20 during the test mode operation, the test signal decoder 53 decodes the test code and outputs the decoded code as a decoded signal TS[n:0].

The resistance values of the plurality of resistances RAF1 to RAFn are set such that the resistance value is increased stepwise by a predetermined value each time from the minimum value to the maximum value. A substantially median value of these resistance values is set so as to be equal to the resistance value (design value) of the broken AF element. Further, the number of the resistances RAF1 to RAFn is greater than the number of the resistances R1 to Rm+1 in the AFVRF circuit 13 (see FIG. 4) (i.e. n>m+1) in order to enable identification of the re stance having a resistance value closest to that of the broken AF element from among the resistances RAF1 to RAFn. This means that the voltage level at the output node N5 of the AF resistance selecting circuit 14 changes at smaller intervals than the change of the voltage level output from the AFVRF circuit 13.

The resistance selector 52 has a plurality of transistor switches connected between the resistances RAF1 to RAFn and the VSS, respectively. The resistance selector 52 selectively turns ON one of the transistor switches connected to the resistances RAF1 to RAFn according to the decoded signal TS [n:0] from the test signal decoder.

When measuring the resistance value of the AF element 12, one of the transistor switches connected to the resistances RAF1 to RAFn is selectively turned ON at the same time with or before the change of the precharge signal PREB from a high level to a low level. Once the precharge signal PREB changes to a low level, the voltage VPERI is supplied to an end of the resistance connected to the transistor switch that has been selectively turned ON. This makes it possible to create, within the AF resistance selecting circuit 14, a state corresponding to the state in which one end of the AF element 12 has been charged in the AF circuit 11. The AF resistance selecting circuit 14 outputs, to the switching circuit 15, a voltage level generated at one end of the resistance connected to the transistor switch which has been turned ON. This voltage level is used as a measurement voltage MLV after the precharge signal PREB has changed to a high level. Although the measurement voltage MLV at the output node N5 of the AF resistance selecting circuit 14 also decreases with the lapse of time, it does not pose any problem during the comparison by the AF determination circuit 12 since the timing of generation of the measurement voltage MLV depends on the precharge signal PREB utilized in the AF circuit 11.

When measuring the resistance value of the AF element 21, the measurement voltage MLV is changed by a predetermined value each time by supplying the test code T[X:0] for sequentially turning ON the resistances RAF1 to RAFn, one at a time, and the precharge signal PREB having the timing corresponding thereto.

Thus, when measuring the resistance value of the AF element 21, the AF determination circuit 12 is supplied with the measurement voltage MLV from the AF resistance selecting circuit 14 as the reference voltage, and the determination outputs DB and DT of the AF determination circuit 12 are read out every time the value of the measurement voltage MLV is changed (for example, increased or decreased stepwise). Accordingly, the resistance value of the AF element 21 can be obtained as a value between the resistance RAFj generating a voltage value corresponding to the measurement voltage MLV at the time when the determination outputs DB and DT are changed and the resistance RAFi generating a voltage value corresponding to the measurement voltage MLV directly before the change of the determination outputs DB and DT.

Figure 6:
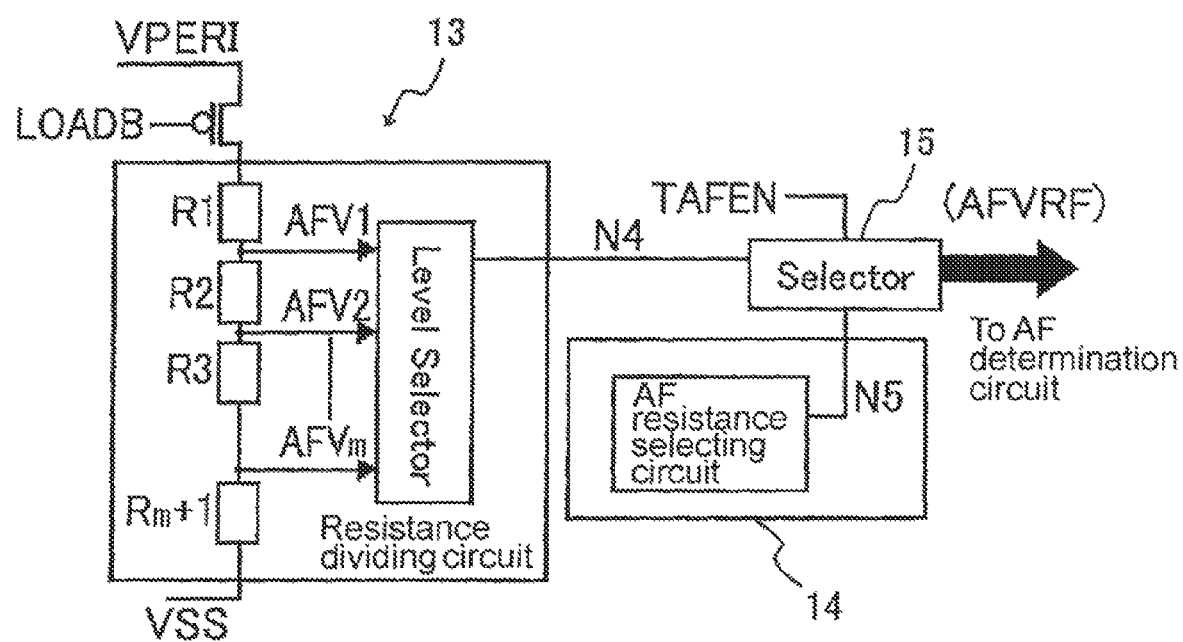
FIG. 6 is a block diagram for explaining operation of a switching circuit included in the semiconductor device of FIG. 1.

Switching Circuit 15:

The switching circuit 15 connected to the AFVRF circuit 13 and the AF resistance selecting circuit 14 is controlled by a signal TAFEN supplied from the control device 20 as shown in FIG. 6. In the normal operating mode and the reference voltage adjustment test mode, the signal TAFEN is at an inactive level, and the determination voltage AFVRF at the output node N4 of the AFVRF circuit 13 is supplied to the AF determination circuit 12 as the reference voltage. In the AF element breakdown resistance value measurement test mode, the signal TAFEN is at an active level, and the measurement voltage MLV at the output node N5 of the AF resistance selecting circuit 14 is supplied to the AF determination circuit 12 as the reference voltage.

As described above, the outputs of the AF determination circuit in the normal operating mode are supplied to the redundant control circuit (not shown), whereas the outputs are supplied to the data input/output terminals during the AF element breakdown resistance value measurement test mode.

Although the present invention has been described above in conjunction with preferred embodiments thereof, the present invention is not limited to the foregoing embodiments but may be modified and changed without departing from the scope and spirit of the invention.

For example, although in the embodiment described above, the plurality of resistances in the AF resistance selecting circuit 14 are sequentially selected one at a time, the combination of combining the plurality of resistances in series and/or in parallel can be changed by means of switches so as to change the combined resistance value. Further, although in the embodiment described above, the AF determination circuit 12 is employed also for measuring the resistance value of the broken AF element in the test mode, a circuit dedicated for the test mode may be separately provided. Further, in the embodiment described above, the AF determination circuit 12 is also utilized for measuring the resistance of the broken AF element in the test mode, a circuit dedicated for the test mode may be provided separately.

What is claimed is:

1. A semiconductor device comprising:
   an antifuse element storing information as one of a broken state and an unbroken state thereof; and
   a measurement unit operative to perform a first operation that is carried out to determine whether the antifuse element is in the broken state or the unbroken state and a second operation that is carried out to measure a resistance value relative to a resistance value of the antifuse element in the broken state,
   wherein the measurement unit comprises:
   a determination voltage generating unit generating a determination voltage;
   a measurement voltage generating unit generating measurement voltage that is independent of the determination voltage; and
   a comparator comparing, in the first operation, a voltage level of one end of the antifuse element with the determination voltage and comparing, in the second operation, the voltage level of the one end of the antifuse element with the measurement voltage.

2. The semiconductor device as claimed in claim 1, wherein the measurement voltage generating unit comprises:
   a plurality of resistance elements, one ends of the resistance elements are connected in common; and
   a selection unit connected in common to the other ends of the resistance elements and selecting one or ones of the resistance elements.

3. The semiconductor device as claimed in claim 1, wherein the determination voltage generating unit maintains, in the first operation, a voltage level of the determination voltage at a substantially constant level, and the measurement voltage generating unit changes, in the second operation, a voltage level of the measurement voltage in stepwise manner.

4. The semiconductor device as claimed in claim 1, further comprising an external terminal, wherein the comparator supplies, in the second operation, a compare result in the external terminal.

5. The semiconductor device as claimed in claim 1, wherein the measurement unit further comprises a selector receiving the determination voltage and the measurement voltage, and the selector supplies, in the first operation, the determination voltage to the comparator and supplies, in the second operation, the measurement voltage to the comparator.

6. The semiconductor device as claimed in claim 1, wherein the first operation is a normal operation and the second operation is a test operation.

* * * * *